United States Patent [19]

Hamilton

[11] Patent Number: 5,239,748
[45] Date of Patent: Aug. 31, 1993

[54] METHOD OF MAKING HIGH DENSITY CONNECTOR FOR BURN-IN BOARDS

[75] Inventor: Harold E. Hamilton, Minneapolis, Minn.

[73] Assignee: Micro Control Company, Minneapolis, Minn.

[21] Appl. No.: 919,527

[22] Filed: Jul. 24, 1992

[51] Int. Cl.[5] ............................................. H01R 9/06
[52] U.S. Cl. ..................................... 29/843; 29/876; 439/60; 439/636; 439/637
[58] Field of Search .................. 439/60, 637; 29/876, 29/874, 882, 884, 843, 840

[56] References Cited

U.S. PATENT DOCUMENTS

| | | | |
|---|---|---|---|
| 3,392,366 | 7/1968 | Nakazawa | 439/637 X |
| 3,744,005 | 7/1973 | Sitzler | 439/637 X |
| 4,095,866 | 6/1978 | Merrill . | |
| 4,298,237 | 11/1981 | Griffith et al. . | |
| 4,560,221 | 12/1985 | Olsson . | |
| 4,598,966 | 7/1986 | Boland . | |
| 4,636,021 | 1/1987 | Bobb et al. | 439/636 X |
| 4,734,041 | 3/1988 | Bruchmann et al. | 439/637 |
| 4,806,103 | 2/1989 | Kniese et al. | 439/60 |
| 4,869,672 | 9/1989 | Andrews, Jr. | 439/60 |
| 4,932,885 | 6/1990 | Scholz | 439/79 |
| 5,024,609 | 6/1991 | Piorunneck | 439/637 |
| 5,026,292 | 6/1991 | Pickles et al. | 439/108 |
| 5,052,936 | 10/1991 | Biechler et al. | 439/60 |
| 5,074,039 | 12/1991 | Hillbish et al. | 29/883 |
| 5,090,116 | 2/1992 | Henschen et al. | 29/876 X |
| 5,162,002 | 11/1992 | Regnier | 439/60 X |

OTHER PUBLICATIONS

Chart of 0.100 Contact Centers (2.54 mm).

*Primary Examiner*—Carl J. Arbes
*Attorney, Agent, or Firm*—Kinney & Lange

[57] ABSTRACT

A method for the construction of a high density electrical connector for connecting a printed circuit board with a burn-in board in a burn-in system. The method comprises the steps of attaching a standard edge connector to a printed circuit board to form a first set of contacts, attaching two outer contact strips to the printed circuit board to form a second set of contacts, and enclosing the outer contact strips and the edge connector in an outer housing. The edge connector and the outer contact strips are secured to the printed circuit board through soldering. A burn-in board having a plurality of contact pads thereon can be inserted into the electrical connector such that the contact pads come into contact with the first and second set of contacts.

9 Claims, 3 Drawing Sheets

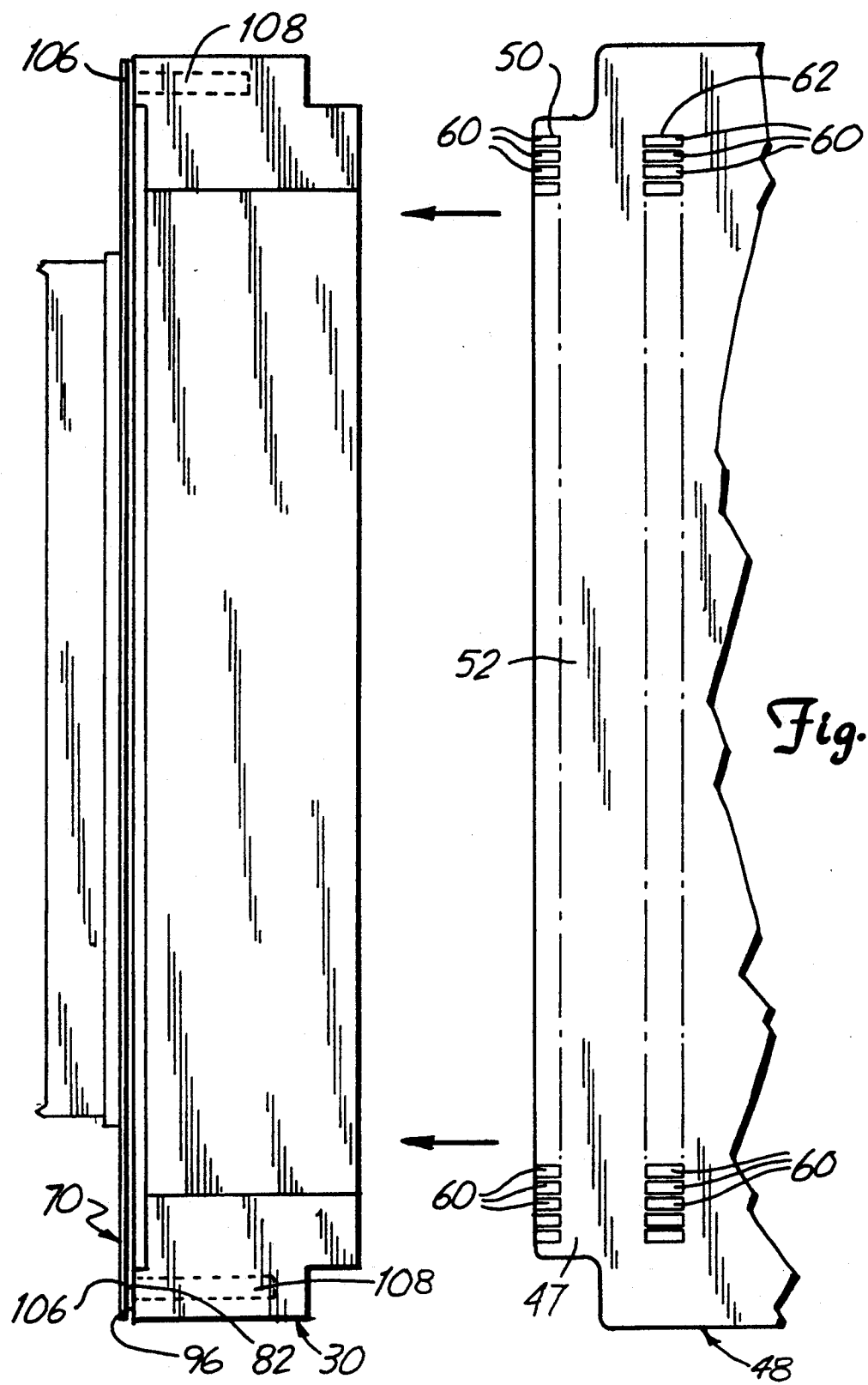

METHOD OF MAKING HIGH DENSITY CONNECTOR FOR BURN-IN BOARDS

BACKGROUND OF THE INVENTION

The present invention relates to high density electrical connectors and, in particular, to a method for manufacturing a high density electrical connector for electrically connecting a burn-in board and a driver/receiver board in a burn-in system.

An increasingly large number of connections are required between the burn-in board and corresponding driver/receiver board in a burn-in system. In the past, connection requirements were met by using an auxiliary board electrically connected to a second driver/receiver board. The auxiliary board extended through the wall of the environmental chamber of the system parallel to the burn-in board and was electrically connected to the burn-in board inside the environmental chamber. An example of such a configuration is shown in the Hamilton U.S. Pat. No. 4,900,948.

Although this configuration provided a large number of electrical connections between the burn-in and driver/receiver boards, it required additional slots in the environmental chamber wall. There is therefore a need for a high density electrical connector that creates a large number of connections between the burn-in board and the driver/receiver board so that the use of an auxiliary board is not required.

Such a high density electrical connector should be designed so that it may be quickly and easily assembled at a relatively low cost. Furthermore, it is advantageous to be able to construct the electrical connector from commonly available prefabricated parts to aid in the ease of assembly.

SUMMARY OF THE INVENTION

The present invention provides a simple, low cost method for the construction of a high density electrical connector for electrically connecting a driver/receiver board and a burn-in board. The method comprises the steps of attaching a prefabricated edge connector to a printed circuit board, attaching a first and a second outer contact strip to the printed circuit board, and inserting the outer contact strips and edge connector into an outer housing.

The edge connector comprises a non-conductive connector housing containing a plurality of inner contacts. The first and second outer contact strips each comprise a plurality of outer contacts held together by a non-conductive web. The printed circuit board has a plurality of apertures therein into which the ends of both the inner contacts and the outer contacts can be inserted.

Once inserted into the apertures of the printed circuit board, both the inner contacts and the outer contacts are soldered in place. The outer housing is then slid over the outer contacts to enclose the edge connector and the outer contact strips. A burn-in board having a plurality of contact pads can be inserted into the outer housing through a slot so that the contact pads come into contact with the inner and outer contacts.

The use of a prefabricated edge connector and prefabricated outer contact strips greatly simplifies the construction of the electrical connector by enabling it to be quickly and easily constructed at a low cost.

BRIEF DESCRIPTION OF THE DRAWINGS

FIG. 3 is a top view of the electrical connector in position on a burn-in board inserted therein.

DETAILED DESCRIPTION OF THE PREFERRED EMBODIMENTS

Figure 1:
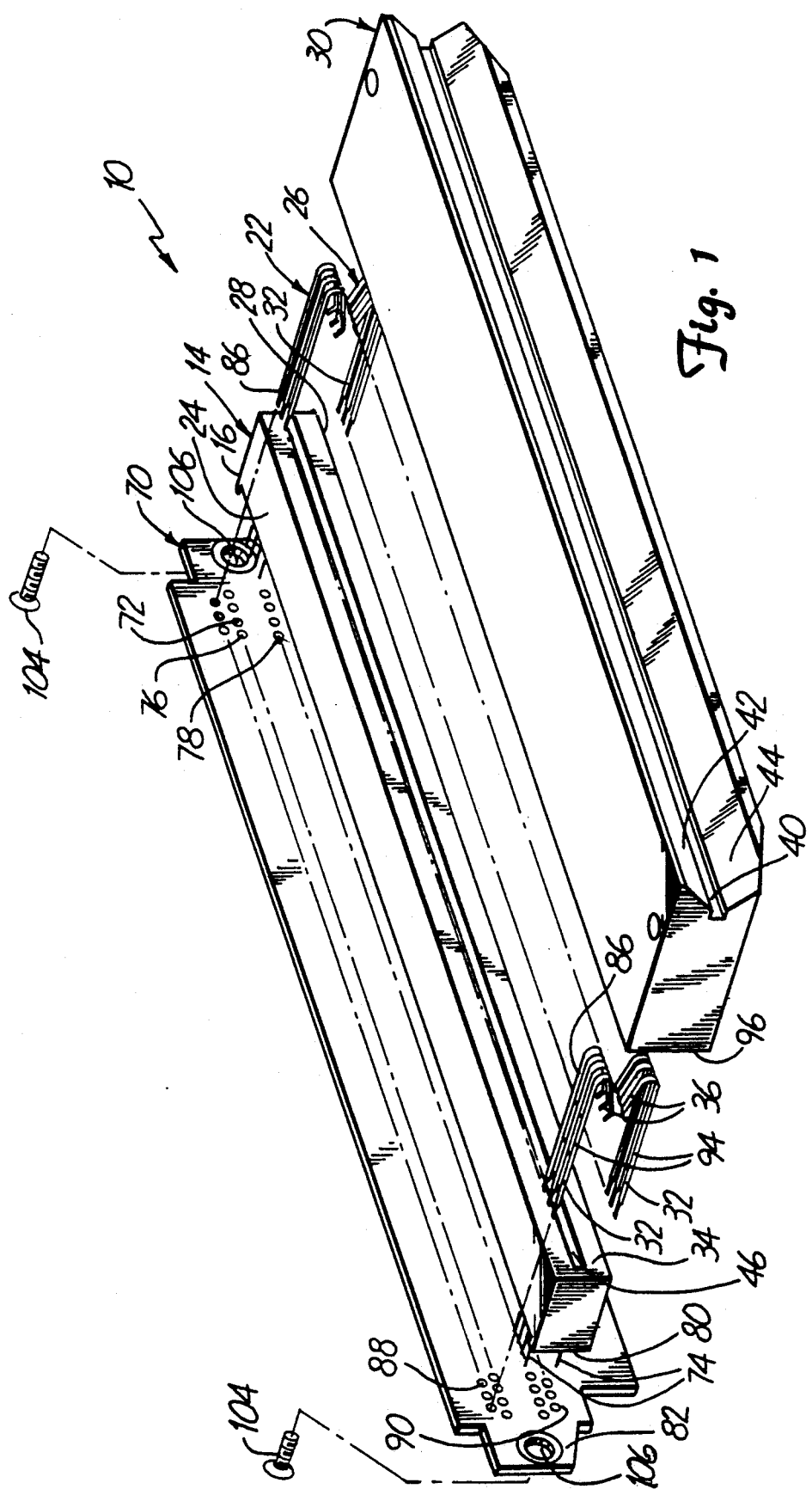
FIG. 1 is an exploded perspective view of the electrical connector of the present invention.
Figure 2:
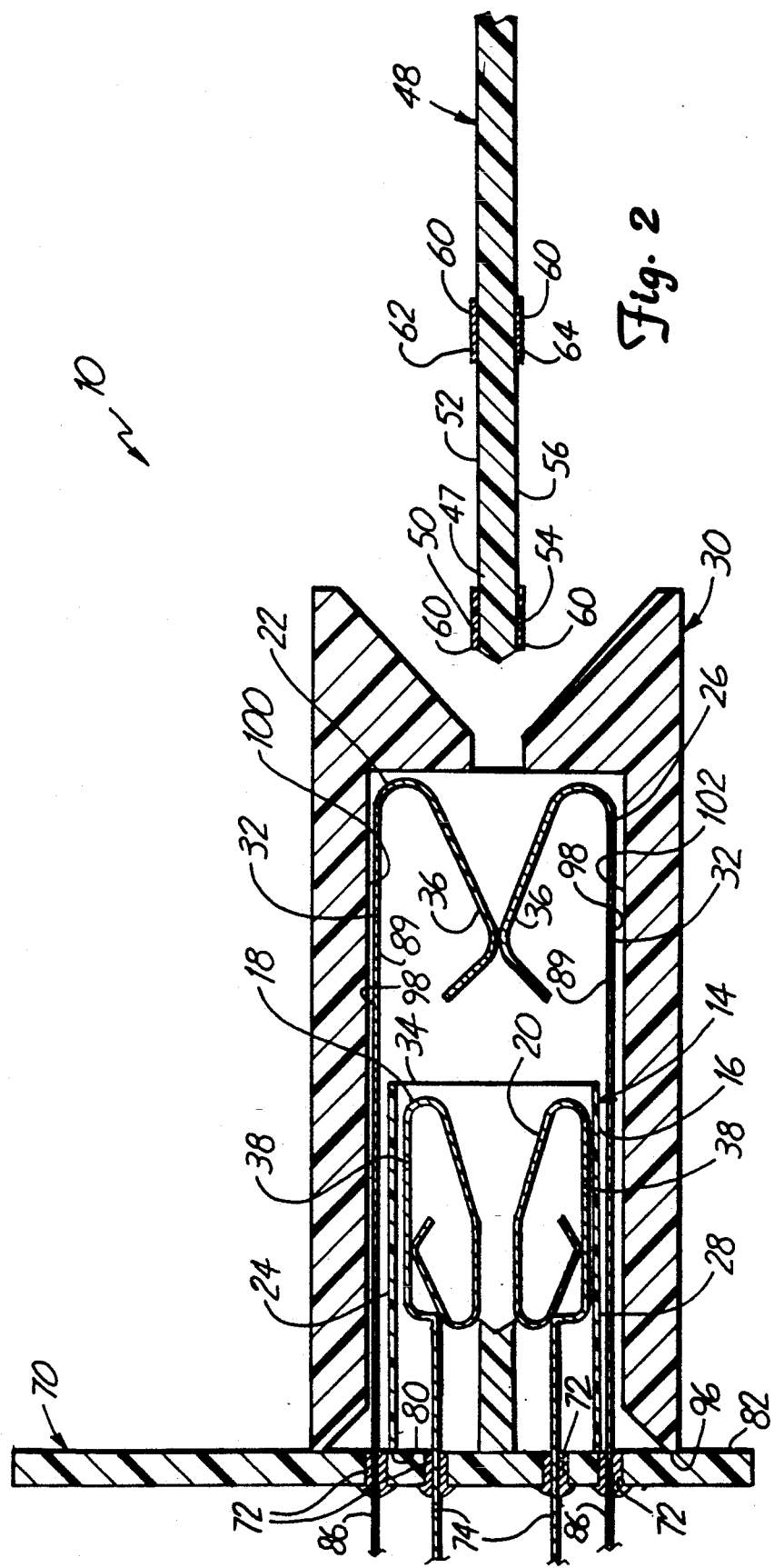
FIG. 2 is a sectional view of the assembled electrical connector and the burn-in board.

An electrical connector 10 constructed according to the present invention is shown in FIGS. 1 and 2. The electrical connector 10 comprises a commercially available prefabricated edge connector 14 having a connector housing 16 inside of which is contained a first inner contact row 18 and a second inner contact row 20. The contacts of rows 18 and 20 are spring loaded and face each other. A first outer contact strip 22 extends along an upper outer surface 24 of the connector housing 16 and second outer contact strip 26 extends along a lower outer surface 28 of the connector housing 16. The first outer contact strip 22, the second outer contact strip 26 and the edge connector 14 are enclosed within an outer housing 30.

Both the first outer contact strip 22 and the second outer contact strip 26 comprise a plurality of outer contacts 32 which extend beyond a first end 34 of the edge connector 14. A first end 36 of each outer contact 32 of the first outer contact strip 22 is aligned with the first end 36 of a corresponding outer contact 32 of the second outer contact strip 26. Both the first inner contact row 18 and the second inner contact row 20 comprise a plurality of inner contacts 38.

An elongated housing slot 40 extends between a top half 42 of the outer housing 30 and a bottom half 44 of the outer housing 30. In addition, a connector slot 46 extends along the first end 34 of the connector housing 16 parallel to the housing slot 40. The housing slot 40 and the connector slot 46 allow a first end 47 of a burn-in board 48 to be inserted into the outer housing 30 and connector housing 16 of the electrical connector 10. Both the housing slot 40 and the connector slot 46 help to guide the burn-in board 48 into the correct position.

Referring to FIGS. 2 and 3, a first inner contact pad row 50 is located on a first side 52 of the burn-in board 48 and a second inner contact pad row 54 is located on a second side 56 of the burn-in board 48. Both the first inner contact pad row 50 and the second inner contact pad row 54 comprise a plurality of contact pads 60 and are located at the first end 47 of the burn in board 48. When the burn-in board 48 is inserted into the electrical connector 10, each contact pad 60 of first inner contact pad row 50 and the second inner contact pad row 54 comes into contact with a corresponding inner contact 38 of the first inner contact row 18 and the second inner contact row 20 of the edge connector 14 respectively.

A first outer contact pad row 62 is located on the first side 52 of the burn-in board 48 and a second outer contact pad row 64 is located on the second side 56 of the burn-in board 48. Both the first outer contact pad row 62 and the second outer contact pad row 64 comprise a plurality of contact pads 60 and are located near the first end 47 of the burn-in board 48. When the burn-in board 48 is inserted into the electrical connector 10, each contact pad 60 of first outer contact pad row 62 and the second outer contact pad row 64 comes into contact with a corresponding outer contact 32 of the first outer contact strip 22 and the second outer contact strip 26 respectively.

The construction of the electrical connector 10 according to the method of the present invention is best shown in FIG. 1. A printed circuit board 70 having a plurality of apertures 72 is provided. The apertures 72 are arranged in four parallel rows and each aperture 72 is of a size for receiving an end of one of the inner or outer contacts 38,32. In a burn-in system, the printed circuit board 70 is typically an adapter board into which the driver/receiver board is plugged. However, the printed circuit board 70 can be the driver/receiver board.

A first end 74 of each inner contact 38 in the first inner contact row 18 is inserted into a corresponding aperture 72 of a first inner aperture row 76 and a first end 74 of each inner contact 38 in the second inner contact row 20 is inserted into a corresponding aperture 72 of a second inner aperture row 78. The inner contacts 38 are inserted until a second end 80 of the connector housing 16 comes into contact with a first side 82 of the printed circuit board 70. The first end 74 of each inner contact 38 is then soldered in place.

The first outer contact strip 22 is attached to the printed circuit board 70 by inserting a second end 86 of each outer contact 32 into a corresponding aperture 72 of a first outer aperture row 88 in the printed circuit board 70. The outer contacts 32 are inserted such that a first surface 89 of each outer contact 32 comes into contact with the upper surface 24 of the connector housing 16. The second end 86 of each outer contact 32 of the first outer contact strip 22 is then soldered in place.

The second outer contact strip 26 is attached to the printed circuit board 70 by inserting the second end 86 of each outer contact 32 into a corresponding aperture 72 of a second outer aperture row 90 in the printed circuit board 70. The outer contacts 32 are inserted such that a first surface 89 of each outer contact 32 comes into contact with the lower surface 28 of the connector housing 16. The second end 86 of each outer contact 32 of the second outer contact strip 26 is then soldered in place.

The outer contacts 32 of the first outer contact strip 22 and the second outer contact strip 26 are held together by a web 94 made of a flexible, non-conducting material. The web 94 enables each outer contact 32 to be easily inserted into the desired aperture 72 and holds each outer contact 32 spaced from adjacent outer contacts 32. The outer contact strips 22,26 can be easily and inexpensively prefabricated according to a variety of specifications.

The outer housing 30 has an opening in a first side 96 into which is inserted the edge connector 14, the first outer contact strip 22 and the second outer contact strip 26. These parts are inserted into the outer housing 30 until the first side 96 of the outer housing 30 comes into contact with the first side 82 of the printed circuit board 70. A second surface 98 of each outer contact 32 of the first outer contact strip 22 comes into contact with an first inner surface 100 of the outer housing 30 while the second surface 98 of each outer contact 32 of the second outer contact strip 26 comes into contact with a second inner surface 102 of the outer housing 30.

The outer housing 30 is secured to the printed circuit board 70 through the use of two screws 104. Each screw 104 is inserted through a hole 106 in the printed circuit board 70 and into a corresponding bore 108 in the first side 96 of the outer housing 30.

The edge connector 14 used can be any one of a number of standard edge connectors commonly available. In addition, the first and second outer contact strips 22,26 can take many forms and are also commercially available. The use of a standard edge connector to supply the inner contacts 38 and the use of two outer contact strips 22 and 28 for the outer contacts 32 greatly simplifies the assembly of the electrical connector 10 of the present invention.

Among the advantages of the present invention is the ease with which the contacts can be inserted into the apertures 72 of the printed circuit board 70. The insertion of one or more rows of contacts at one time eliminates any difficulty in working around adjacent contacts. Also, the connector housing 16 provides an excellent insulator between the inner and outer contacts of the electrical connector 10.

The outer housing 30 can be constructed through the use of a molded body or it can be machined. This allows the outer housing 30 to be inexpensively constructed in both large and small quantities. Although the outer housing 30 was described as being secured to the printed circuit board 70 by two screws 104, the outer housing 30 can be secured to the printed circuit board 70 in a variety of ways such as through the use of snaps or an adhesive.

If desired, an additional layer of contact strips extending beyond the outer contact strips 22,26 can be attached to the printed circuit board 70 to provide additional contacts between the printed circuit board 70 and the burn-in board 48. In such an arrangement, the outer housing must have a larger size to enclose the additional contact strips. In addition, a non-conductive layer must be placed between the outer contact strips 22,26 and the additional contact strips to prevent them from contacting each other. The method of construction would be the same as that in the first embodiment with the additional step of inserting the additional contact strips in the printed circuit board 70.

Although the present invention has been described with reference to preferred embodiments, workers skilled in the art will recognize that changes may be made in form and detail without departing from the spirit and scope of the invention.

What is claimed is:

1. A method of manufacturing a high density electrical connector for electrically connecting a burn-in board having two rows of contact pads on each of a first side and a second side to a printed circuit board in a burn-in system, the method comprising the steps of:

providing a standard edge connector having a connector housing made of a non-conductive material, the connector housing containing a first inner contact row and a second inner contact row, each inner contact row comprising a plurality of inner contacts;

attaching the standard edge connector to a first side of the printed circuit board by inserting a first end of each inner contact into one of a plurality of apertures in the printed circuit board and soldering it in place;

attaching a prefabricated first outer contact strip comprising a plurality of outer contacts to the printed circuit board by inserting a first end of each outer contact into one of the apertures and soldering it in place;

attaching a prefabricated second outer contact strip comprising a plurality of outer contacts to the printed circuit board by inserting the first end of each outer contact into one of the apertures and soldering it in place;

enclosing the first outer contact strip, the second outer contact strip and the standard edge connector within an outer housing; and securing the outer housing to the printed circuit board.

2. The method of claim 1 wherein the printed circuit board comprises a driver/receiver board.

3. The method of claim 1 wherein the printed circuit board comprises an adapter board that can be electrically connected with a driver/receiver board.

4. The method of claim 1 wherein the outer contacts in the first outer contact strip are attached to each other by a flexible, non-conductive material.

5. The method of claim 1 wherein the outer contacts in the second outer contact strip are attached to each other by a flexible, non-conductive material.

6. The method of claim 1 wherein the step of enclosing the first outer contact strip, the second outer contact strip and the standard edge connector comprises sliding the outer housing over the outer contacts such that each outer contact is held between an outer surface of the connector housing and an inner surface of the outer housing.

7. The method of claim 1 wherein the step of securing the outer housing to the printed circuit board comprises inserting a screw through each of two holes in the printed circuit board and into a corresponding one of two receiving holes in the outer housing.

8. The method of claim 1 wherein an elongated slot in a first end of the outer housing permits the burn-in board to be inserted in the outer housing.

9. The method of claim 8 wherein an elongated connector slot in a first end of the connector housing permits the burn-in board to be inserted in the connector housing.

* * * * *